(12) United States Patent
Yonemura et al.

(10) Patent No.: US 10,134,977 B2
(45) Date of Patent: Nov. 20, 2018

(54) PIEZOELECTRIC ELEMENT, METHOD FOR MANUFACTURING THE SAME, AND PIEZOELECTRIC ELEMENT-APPLIED DEVICE

(71) Applicant: Seiko Epson Corporation, Tokyo (JP)

(72) Inventors: Takayuki Yonemura, Suwa (JP); Tsutomu Asakawa, Shiojiri (JP)

(73) Assignee: Seiko Epson Corporation (JP)

( * ) Notice: Subject to any disclaimer, the term of this patent is extended or adjusted under 35 U.S.C. 154(b) by 484 days.

(21) Appl. No.: 14/885,088

(22) Filed: Oct. 16, 2015

(65) Prior Publication Data

US 2016/0111628 A1 Apr. 21, 2016

(30) Foreign Application Priority Data

Oct. 17, 2014 (JP) ................... 2014-213078

(51) Int. Cl.
*H01L 41/187* (2006.01)
*H01L 41/047* (2006.01)
(Continued)

(52) U.S. Cl.
CPC .......... *H01L 41/29* (2013.01); *B41J 2/14233* (2013.01); *B41J 2/161* (2013.01); *B41J 2/1628* (2013.01);
(Continued)

(58) Field of Classification Search
CPC . H01L 41/29; H01L 41/0477; H01L 41/0815; H01L 41/0973; H01L 41/1875;
(Continued)

(56) References Cited

U.S. PATENT DOCUMENTS 6,297,580 B1 * 10/2001 Takayama .......... H03H 9/02929
310/363
7,732,997 B2 * 6/2010 Ishikura .................. B41J 2/161
310/363
(Continued)

FOREIGN PATENT DOCUMENTS

JP 2001-223404 A 8/2001
JP 2005-340428 A 12/2005
(Continued)

OTHER PUBLICATIONS

Toshio Ogawa, "Giant Transverse-Mode Electromechanical Coupling Factor and Piezoelectric Strain in Relaxor Single-Crystal Plates Evaluated Using P-E Hysteresis Loop", Japanese Journal of Applied Physics, vol. 47, No. 9, May 12, 2008, pp. 7655-7658.

*Primary Examiner* — Thomas Dougherty
(74) *Attorney, Agent, or Firm* — Harness, Dickey & Pierce, P.L.C.

(57) ABSTRACT

A piezoelectric element has, from a substrate side, a first electrode, a piezoelectric layer containing a composite oxide of an $ABO_3$ type perovskite structure containing Mg, and a second electrode, which are laminated, in which the first electrode includes a diffusion suppressing layer which suppresses diffusion of the Mg and a diffusion layer which diffuses the Mg as compared with the diffusion suppressing layer, and the diffusion suppressing layer is provided on the substrate side relative to the diffusion layer.

8 Claims, 10 Drawing Sheets

(51) Int. Cl.
*H01L 41/29* (2013.01)
*B41J 2/14* (2006.01)
*H01L 41/08* (2006.01)
*H01L 41/09* (2006.01)
*B41J 2/16* (2006.01)

(52) U.S. Cl.
CPC ............ *B41J 2/1629* (2013.01); *B41J 2/1631* (2013.01); *B41J 2/1645* (2013.01); *H01L 41/0477* (2013.01); *H01L 41/0815* (2013.01); *H01L 41/0973* (2013.01); *H01L 41/1875* (2013.01); *B41J 2002/14241* (2013.01); *B41J 2002/14491* (2013.01)

(58) Field of Classification Search
CPC ...... B41J 2/14233; B41J 2/161; B41J 2/1628; B41J 2/1629; B41J 2/1631; B41J 2/1645
USPC ..... 310/358, 363–365; 252/62.9 PZ, 62.9 R; 501/134
See application file for complete search history.

(56) References Cited

U.S. PATENT DOCUMENTS

| | | | |
|---|---|---|---|
| 2002/0149901 A1* | 10/2002 | Shindo | ............... C04B 41/009 361/311 |
| 2007/0090728 A1 | 4/2007 | Matsuda et al. | |
| 2008/0129155 A1* | 6/2008 | Iezumi | ............... B32B 18/00 310/358 |
| 2010/0244632 A1 | 9/2010 | Maekawa et al. | |
| 2011/0220734 A1 | 9/2011 | Yonemura et al. | |

FOREIGN PATENT DOCUMENTS

| | | |
|---|---|---|
| JP | 2007-088441 A | 4/2007 |
| JP | 2007-204337 A | 8/2007 |
| JP | 2008-078408 A | 4/2008 |
| JP | 2010-238856 A | 10/2010 |
| JP | 2011-189586 A | 9/2011 |
| JP | 2013-118252 A | 6/2013 |
| JP | 2014-157850 A | 8/2014 |

* cited by examiner

PIEZOELECTRIC ELEMENT, METHOD FOR MANUFACTURING THE SAME, AND PIEZOELECTRIC ELEMENT-APPLIED DEVICE

BACKGROUND

1. Technical Field

The present invention relates to a piezoelectric element, a method for manufacturing the same, and a piezoelectric element-applied device.

2. Related Art

Heretofore, various piezoelectric element-applied devices employing a piezoelectric element for the electromechanical conversion mechanism of a Micro Electro Mechanical System (MEMS) element have been reported. In the piezoelectric element-applied devices, a MEMS actuator, a MEMS sensor, and the like are mounted as the MEMS element. For example, in a liquid ejecting head typified by an ink jet recording head, a pressure generating chamber communicating with a nozzle opening is partially configured from a diaphragm and also the MEMS actuator is configured by providing a piezoelectric element in the diaphragm. Ink in the pressure generating chamber is pressurized by deforming the diaphragm by voltage application to the MEMS actuator, whereby ink droplets are discharged from the nozzle opening.

As a piezoelectric layer configuring this kind of piezoelectric element, a piezoelectric layer containing lead zirconate titanate (PZT) (Japanese Patent Laid-Open No. 2001-223404) is mentioned. In addition thereto, there is a circumstance in which a piezoelectric layer capable of improving the piezoelectric characteristics has been researched in response to recent demands for a further size reduction, higher performance, and the like of the MEMS element.

For example, a piezoelectric layer has been proposed which contains a single crystal $(Pb(Mg_{1/3}, Nb_{2/3})O_3$—Pb-TiO$_3$: PMN-PT) which contains a composite oxide of perovskite type oxides represented by General Formula $ABO_3$ and in which lead magnesium niobate and lead titanate form a solid solution (Japanese Patent Laid-Open No. 2007-088441). The PMN-PT is known to show high electromechanical coupling coefficient, piezoelectric constant, and specific dielectric constant (T. Ogawa, Jpn. J. Appl. Phys., 47, 7655-7658 (2008)). Thus, an improvement of the piezoelectric characteristics is expected by obtaining a piezoelectric layer using such PMN-PT. However, the PMN-PT has been pointed out to have a possibility that Mg having a small atomic number is segregated on the interface between the piezoelectric layer and a lower electrode or diffuses into the lower electrode to reach the diaphragm in the lower electrode in a baking process which is one of the formation processes of the piezoelectric layer. When Mg is segregated on the interface between the piezoelectric layer and the lower electrode, a good interface cannot be formed, and thus the insulation properties and the breakdown voltage decrease, which leads to a reduction in reliability. Moreover, when Mg reaches the diaphragm, the Mg reacts with constituent materials (for example, Si) of the diaphragm on the interface between the lower electrode and the diaphragm to cause shape defects and the like, which may lead to a reduction in reliability.

From the viewpoint of preventing such defects, it has been proposed to provide a titanium oxide layer and a bismuth containing layer between a first electrode and a diaphragm under a piezoelectric layer containing Bi, although the diffusing metal types are different (Japanese Patent Laid-Open No. 2011-189586). Japanese Patent Laid-Open No. 2011-189586 describes that the titanium oxide layer and the bismuth containing layer serve as a stopper and can prevent further diffusion of Bi passing through the first electrode into the diaphragm.

However, when the titanium oxide layer described in Japanese Patent Laid-Open No. 2011-189586 is provided as a stopper layer against Mg contained in the PMN-PT between the first electrode and the diaphragm, the diffusing Mg and the titanium oxide react with other, which may cause a reduction in adhesiveness between the first electrode and the diaphragm and shape defects.

When a configuration of suppressing the diffusion of the Mg by the first electrode is employed, the piezoelectric layer and the first electrode cannot form a good interface, and thus the insulation properties and the breakdown voltage decrease, which may lead to a reduction in reliability.

As described above, with the former technique, it has been difficult to secure high reliability using a material (for example, PMN-PT) useful for an improvement of the piezoelectric characteristics. Such problems similarly arise in the case of piezoelectric elements including piezoelectric materials containing Mg, without being limited to the case where the PMN-PT is used. Moreover, the problems similarly arise also in other piezoelectric element-applied devices carrying the MEMS actuator, the MEMS sensor, and the like employing such a piezoelectric element, without being limited to the liquid ejecting head.

SUMMARY

An advantage of some aspects of the invention is to provide a piezoelectric element capable of improving the piezoelectric characteristics and capable of securing high reliability, a method for manufacturing the same, and a piezoelectric element-applied device.

According to an aspect of the present invention which solves the problems described above, a piezoelectric element has, from a substrate side, a first electrode, a piezoelectric layer including a composite oxide of an $ABO_3$ type perovskite structure containing Mg, and a second electrode, which are laminated, in which the first electrode has a diffusion suppressing layer which suppresses diffusion of the Mg and a diffusion layer which diffuses the Mg as compared with the diffusion suppressing layer, and the diffusion suppressing layer is provided on the substrate side relative to the diffusion layer.

According to the aspect, the piezoelectric characteristics can be improved by configuring a piezoelectric layer with a predetermined composite oxide containing Mg. In addition, the first electrode has the diffusion suppressing layer and the diffusion suppressing layer is provided on the substrate side relative to the diffusion layer. Therefore, the Mg from the piezoelectric layer can be prevented from passing through the first electrode and reaching the substrate. Moreover, since the diffusion suppressing layer is provided on the substrate side relative to the diffusion layer, the Mg from the piezoelectric layer can be diffused into the diffusion layer to be able to be unevenly distributed in the first electrode, specifically in front of the diffusion suppressing layer, so that the Mg can also be prevented from being unevenly distributed on the interface between the piezoelectric layer and the first electrode. As described above, an improvement of the piezoelectric characteristics can be achieved and a good interface between the piezoelectric layer and the first electrode and a good interface between the first electrode and the diaphragm can be formed, so that high reliability can be secured. The Mg is generally an element contained in the B site.

It is preferable to have a Mg uneven distribution layer in which the Mg is unevenly distributed on the diffusion suppressing layer side of the diffusion layer.

It is also preferable that, when the intensity of the Mg is measured by secondary ion mass spectrometry in a direction from the piezoelectric layer to the substrate, the maximum intensity of the Mg in the Mg uneven distribution layer is higher than the intensity of the Mg of the diffusion layer and the diffusion suppressing layer. The presence of the Mg uneven distribution layer supports the fact that the Mg diffusion suppression effect obtained by the diffusion suppressing layer is high. More specifically, by providing the Mg uneven distribution layer, high reliability can be more certainly secured.

It is also preferable that the diffusion layer contains at least one selected from the group consisting of Ir, $LaNiO_3$, and $SrRuO_3$. According to this aspect, the Mg from the piezoelectric layer can be suitably diffused into the diffusion layer. Therefore, the Mg from the piezoelectric layer can be prevented from being excessively unevenly distributed on the interface between the piezoelectric layer and the first electrode, so that higher reliability can be secured.

It is also preferable for the piezoelectric layer to further contain at least one selected from the group consisting of Pb, Bi, K, and Na in the A site of the $ABO_3$ type perovskite structure and to contain the Mg and further contain at least one selected from the group consisting of Nb, Ti, and Fe in the B site of the $ABO_3$ type perovskite structure. According to this aspect, a composite oxide containing a tetragonal ceramic in which lead magnesium niobate ($Pb(Mg_{1/3}, Nb'_{2/3})O_3$) and lead titanate ($PbTiO_3$), for example, form a solid solution can be obtained. By configuring the piezoelectric layer with the composite oxide, a further improvement of the piezoelectric characteristics can be achieved. In addition, composite oxides, such as bismuth magnesium titanate ($Bi(Mg, Ti)O_3$), bismuth ferrate magnesium ($Bi(Fe, Mg)O_3$), lead magnesium niobate ($Pb(Mg, Nb)O_3$), and potassium sodium bismuth magnesium niobate ($(K, Na, Bi)(Mg, Nb)O_3$), can be obtained. By configuring the piezoelectric layer with the composite oxides, an improvement of the piezoelectric characteristics can also be achieved.

It is also preferable for the diffusion suppressing layer to contain Pt (platinum). According to this aspect, the diffusion of the Mg from the piezoelectric layer can be suitably suppressed. Therefore, the Mg from the piezoelectric layer becomes difficult to reach the substrate, so that higher reliability can be secured.

According to another aspect of the present invention which solves the problems described above, a piezoelectric element-applied device has the piezoelectric element described in any one of the aspects above. According to this aspect, a piezoelectric element-applied device excellent in various characteristics having the piezoelectric element capable of achieving an improvement of the piezoelectric characteristics and capable of securing high reliability can be provided.

According to a still another aspect of the present invention which solves the problems described above, a method for manufacturing a piezoelectric element having, from a substrate side, a first electrode, a piezoelectric layer containing a composite oxide of an $ABO_3$ type perovskite structure containing Mg, and a second electrode, which are laminated, in which a process of forming the first electrode includes a process of providing a diffusion suppressing layer which suppresses diffusion of the Mg and a process of providing a diffusion layer which diffuses the Mg as compared with the diffusion suppressing layer on the diffusion suppressing layer. According to this aspect, the above-described piezoelectric element capable of achieving an improvement of the piezoelectric characteristics and capable of securing high reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
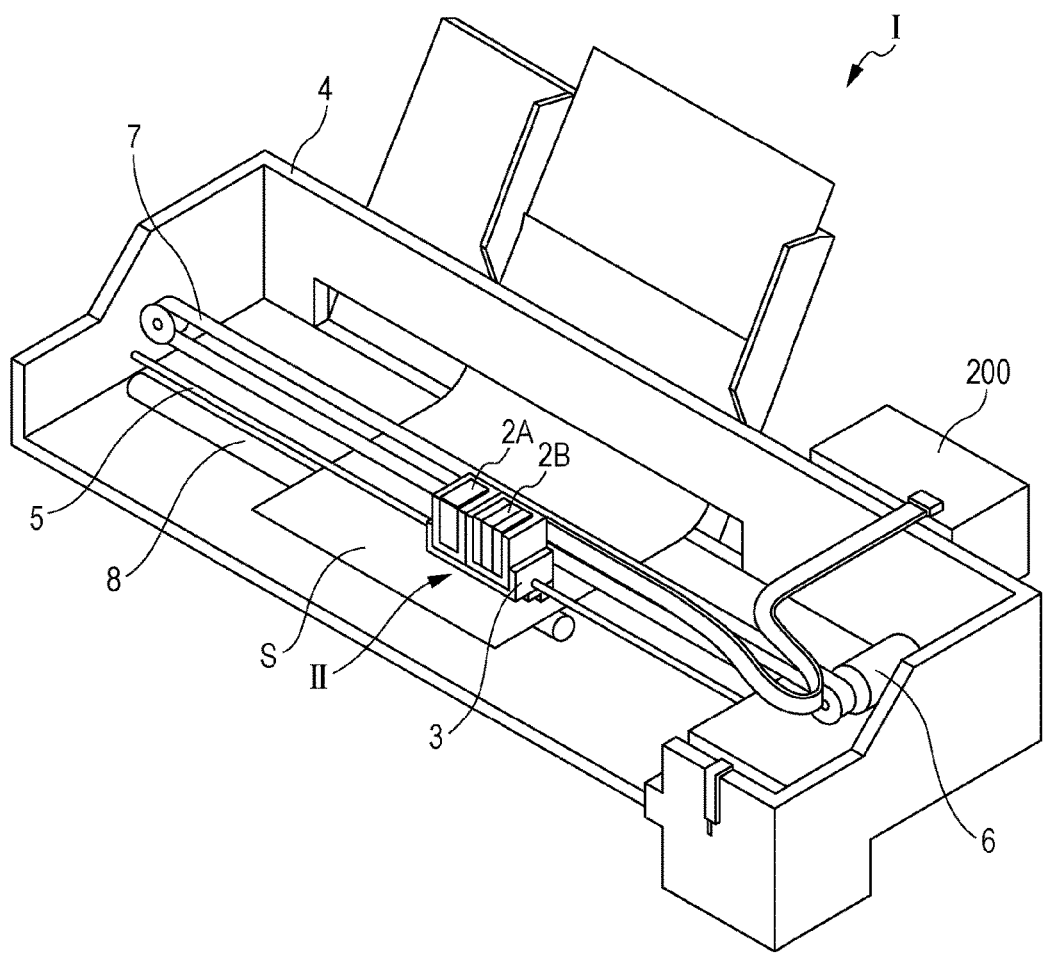
FIG. 1 is a perspective view illustrating the schematic configuration of a recording apparatus according to Embodiment 1.

FIG. 1 is a perspective view illustrating an ink jet recording apparatus (liquid ejecting apparatus) carrying an ink jet recording head (liquid ejecting head) which is an example of a piezoelectric element-applied device according to Embodiment 1 of the present invention.

As illustrated in FIG. 1, in an ink jet recording apparatus I, an ink jet recording head unit II (head unit) having a plurality of ink jet recording heads is detachably attached to cartridges 2A and 2B configuring an ink supply means. A carriage 3 carrying the head unit II is provided on a carriage shaft 5 attached to an apparatus body 4 in such a manner as to be movable in the axial direction and, for example, a black ink composition and a color ink composition are individually discharged.

Due to the fact that the driving force of a drive motor 6 is transmitted to the carriage 3 through a plurality of gears, which are not illustrated, and a timing belt 7, the carriage 3 carrying the head unit II is moved along the carriage shaft 5. On the other hand, a transport roller 8 as a transport means is provided in the apparatus body 4 and a recording sheet S which is a recording medium, such as paper, is transported by the transport roller 8. The transport means for transporting the recording sheet S is not limited to the transport roller and may be a belt, a drum, and the like.

According to this ink jet recording apparatus I, the ink jet recording head according to this embodiment is mounted. Therefore, an improvement of the piezoelectric characteristics and, particularly, an improvement of the ink ejection characteristics can be achieved. In addition thereto, a risk of occurrence of shape defects, a risk of an increase in a leakage current, and the like during film formation and processing, which was not able to be prevented only by former techniques, can be eliminated, and high reliability can be secured.

Figure 2:
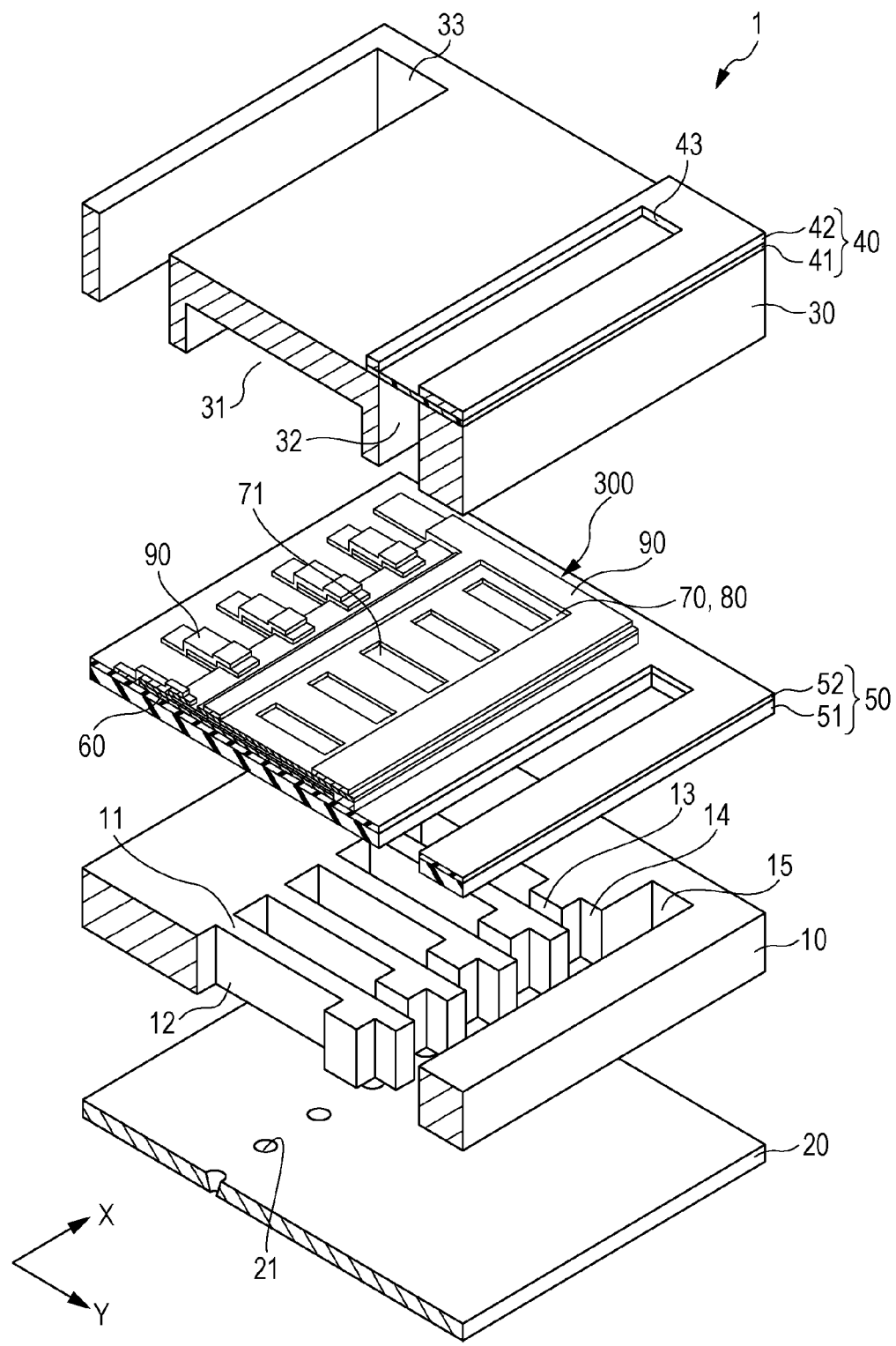
FIG. 2 is an exploded perspective view of a recording head according to Embodiment 1.
Figure 3A:
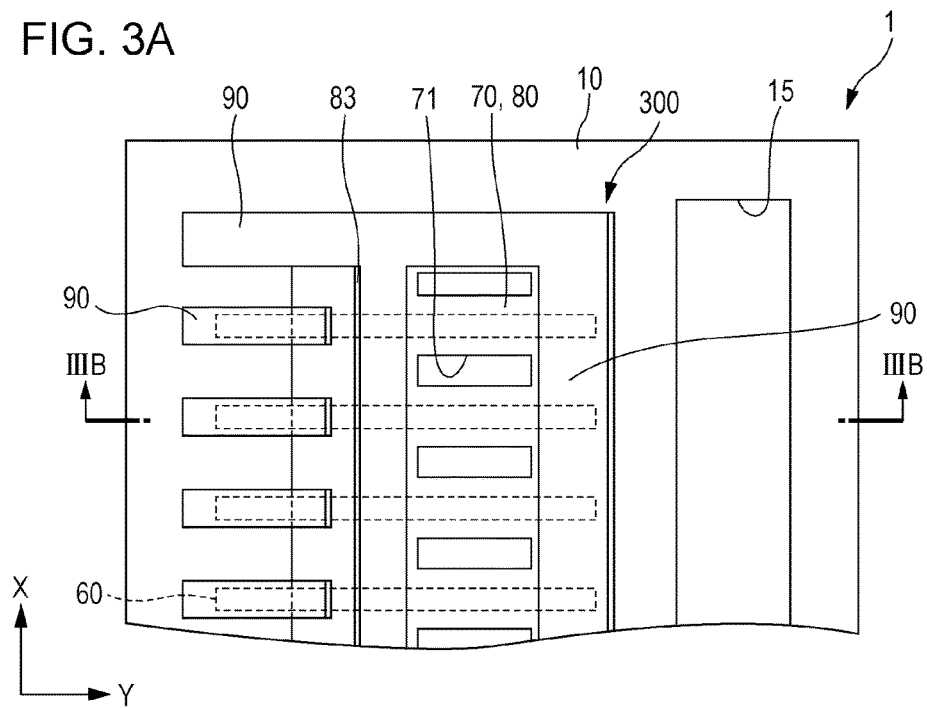
FIG. 3A is a plan view of the recording head according to Embodiment 1.
Figure 3B:
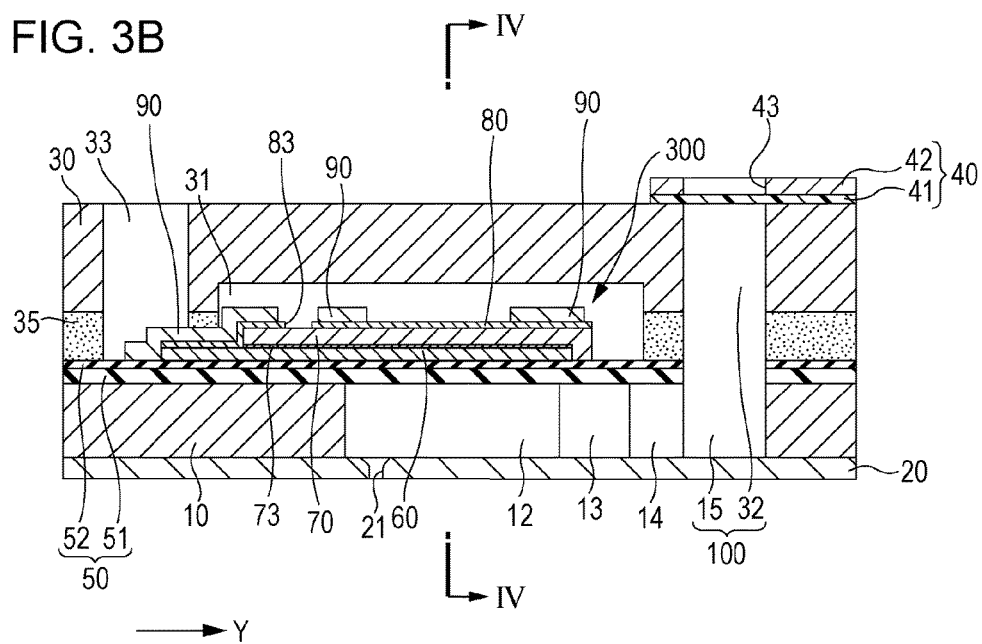
FIG. 3B is a cross sectional view of the recording head according to Embodiment 1.

An example of the ink jet recording head 1 mounted in such an ink jet recording apparatus I is described with reference to FIGS. 2 to 3B. FIG. 2 is an exploded perspective view of the ink jet recording head according to this embodiment. FIG. 3A is a plan view on the side of a piezoelectric element of a substrate (flow passage formation substrate). FIG. 3B is a cross sectional view along the IIIB-IIIB line of FIG. 3A.

As illustrated in FIGS. 2 to 3B, in a flow passage formation substrate 10, pressure generating chambers 12 are divided by a plurality of partitions 11 and the pressure generating chambers 12 are disposed side by side along a direction in which nozzle openings 21 discharging the same color ink are disposed side by side. Hereinafter, the direction in which the pressure generating chambers 12 are side by side in the flow passage formation substrate 10 is referred to as a width direction or a first direction X and a direction which is orthogonal to the first direction X and forms a substrate plane is referred to as a second direction Y.

On one end portion side in the second direction Y of each pressure generating chamber 12 disposed side by side in the flow passage formation substrate 10, an ink supply path 13 in which the opening area is reduced by narrowing one side of the pressure generating chamber 12 from the first direction X and a communication path 14 having almost the same width as the width of the first direction X in the pressure generating chamber 12 are divided by the plurality of partitions 11. On the outer side (side opposite to the pressure generating chamber 12 in the second direction Y) of the communication path 14, a communication portion 15 configuring a part of a manifold 100 serving as a common ink chamber of each pressure generating chamber 12 is formed. More specifically, a liquid flow passage configured from the pressure generating chambers 12, the ink supply paths 13, the communication path 14, and the communication portion 15 is formed in the flow passage formation substrate 10.

To one surface side of the flow passage formation substrate 10, a nozzle plate 20 is joined with an adhesive, a thermal fusion bonding film, or the like. In the nozzle plate 20, the nozzle openings 21 are formed along the first direction X in such a manner so that each nozzle opening 21 communicates with each pressure generating chamber 12.

On the other surface side opposite to the one surface side of the flow passage formation substrate 10, a diaphragm 50 containing an elastic film 51 containing silicon dioxide ($SiO_2$) and the like and an insulator film 52 containing zirconium oxide ($ZrO_2$) and the like, for example, are provided. However, the configuration of the diaphragm 50 is not limited to the example described above and a part of the flow passage formation substrate 10 can also be processed to be thin for use. Various constituent materials forming the diaphragm 50 are not limited to the examples mentioned above.

On the insulator film 52, an adhesion layer (not illustrated) containing Ti and the like, for example, and having a thickness of about 10 to 50 μm is provided. On the adhesion layer, first electrodes 60 having a thickness of about 0.2 μm are provided. A piezoelectric layer 70 having a thickness of about 3.0 μm or less and preferably about 0.5 to 1.5 μm is provided in such a manner as to be overlapped with the adhesion layer and the first electrodes 60 and further a second electrode 80 having a thickness of about 0.05 μm is provided in such a manner as to be overlapped with the piezoelectric layer 70. Herein, the piezoelectric element 300 refers to a portion containing the first electrode 60, the piezoelectric layer 70, and the second electrode 80.

The piezoelectric element 300 of this embodiment is provided with a diffusion suppressing layer 60*a* which suppresses diffusion of Mg on the flow passage formation substrate 10 side of the first electrode 60 and a diffusion layer 60*b* which diffuses Mg as compared with the diffusion suppressing layer 60*a* on the piezoelectric layer 70 side relative to the diffusion suppressing layer 60*a* of the first electrode 60. The diffusion suppressing layer 60*a* and the diffusion layer 60*b* are mainly configured from materials different from each other. The diffusion suppressing layer 60*a* has a function of suppressing diffusion of metal contained in the piezoelectric layer 70. The diffusion layer 60*b* has a function of diffusing the metal as compared with the diffusion suppressing layer 60*a*. As described above, the first electrode 60 is configured from a laminate of the diffusion suppressing layer 60*a* and the diffusion layer 60*b* having functions opposite to each other in this embodiment.

The first electrode 60, the piezoelectric layer 70, and the second electrode 80 are not limited to those which are adjacent to each other and another member may be interposed therebetween insofar as the scope of the present invention is not altered. For example, one in which a metal layer (not illustrated) containing metal, such as Ti, a base layer 73 containing PZT, and a predetermined seed layer (not illustrated) containing another composite oxide of the perovskite structure are disposed between the first electrode 60 and the piezoelectric layer 70 is also included in the piezoelectric element 300. The insulator film 52 and the adhesion layer can be omitted and the piezoelectric element 300 may be directly formed on the elastic film 51 without providing the insulator film 52 and the adhesion layer.

Herein, a combination of the piezoelectric element 300 and one acting as a diaphragm which causes displacement by the drive of the piezoelectric element 300 is referred to as an actuator. In the example described above, a portion containing the diaphragm 50 and the first electrodes 60 can act as a diaphragm but the configuration is not limited to the example. A configuration may be acceptable in which a portion in which one or more of the elastic film 51, the insulator film 52, and the adhesion layer is/are not provided may act as a diaphragm or a configuration may be acceptable in which all of the components are not provided and only the first electrodes 60 act as a diaphragm. A configuration may be acceptable in which the piezoelectric element 300 itself substantially acts as a diaphragm. However, when the first electrodes 60 are directly provided on the flow passage formation substrate 10, it is preferable to protect the first electrodes 60 with an insulating protective film and the like in such a manner that the first electrodes 60 and ink may not be brought into conduction.

In general, in the piezoelectric element 300, either one of the electrodes serves as a common electrode and the other electrode serves as an individual electrode by patterning in each pressure generating chamber 12. In this embodiment, the second electrode 80 serves as a common electrode which is continuously formed over the plurality of pressure generating chamber 12 and the first electrodes 60 serve as the individual electrodes but the reversed configuration due to a drive circuit and the like may be.

In the first electrode 60, both ends of the first electrode 60 are extended to the outside of the pressure generating chamber 12 in the second direction Y. With respect to the piezoelectric layer 70, one end portion on the side of the ink supply path 13 is located on the outer side relative to an end portion of the first electrode 60 and an end portion on a side (nozzle opening 21 side) opposite to the ink supply path 13 is located on the inner side relative to an end portion of the first electrode 60 in the second direction Y. More specifically, in the first electrode 60, the end portion on the side of the ink supply path 13 is covered with the piezoelectric layer 70 but the end portion on the side of the nozzle opening 21 is not covered with the piezoelectric layer 70.

In the piezoelectric layer 70, a concave portion 71 corresponding to each partition 11 is formed. In the first direction X, the width of the concave portion 71 is almost the same or larger than the width between the partitions 11. Thus, the rigidity of a portion (a so-called arm portion of the diaphragm 50) facing the end portion in the second direction Y of the pressure generating chamber 12 of the diaphragm 50 is suppressed, so that the piezoelectric element 300 can be favorably displaced.

The second electrode 80 is provided on a surface opposite to the surface on which the first electrode 60 is provided of the piezoelectric layer 70. A lead electrode 90 is connected to the first the electrodes 60 and the second electrode 80. Such a lead electrode 90 can be formed by forming the lead electrode 90 over one surface of the flow passage formation substrate 10, and then patterning the lead electrode 90 into a predetermined shape.

Onto the flow passage formation substrate 10 on which the piezoelectric element 300 is formed, a protective substrate 30 which protects the piezoelectric element 300 is joined with an adhesive 35. The protective substrate 30 is provided with a piezoelectric element holding portion 31 which is a concave portion defining a space for accommodating the piezoelectric element 300 and is also provided with a manifold portion 32 configuring a part of the manifold 100. The manifold portion 32 is formed over the width direction of the pressure generating chamber 12 penetrating the protective substrate 30 in a thickness direction (a direction vertical to the first direction X and the second direction Y) and communicates with the communication portion 15 of the flow passage formation substrate 10 as described above.

Separately from the manifold portion 32, a through-hole 33 penetrating in the thickness direction in such a manner as to expose the lead electrode 90 connected to each first electrode 60 is formed in the protective substrate 30. To the protective substrate 30, a compliance substrate 40 containing a sealing film 41 and a fixed substrate 42 is joined and one surface of the manifold portion 32 is sealed with the sealing film 41. A region facing the manifold 100 of the fixed substrate 42 forms an opening 43 obtained by completely removing the fixed substrate in the thickness direction and one surface of the manifold 100 is sealed only by the sealing film 41.

In such an ink jet recording head of this embodiment, ink is taken in from an ink introduction port connected to an external ink supply means which is not illustrated, the inside from the manifold 100 to the nozzle openings 21 is filled with the ink, and then a voltage is applied between each first electrode 60 and the second electrode 80 corresponding to each pressure generating chamber 12 in accordance with a recording signal from a drive circuit which is not illustrated to bend and deform the diaphragm 50, the adhesion layer, the first electrode 60, and the piezoelectric layer 70. Thus, the pressure in each pressure generating chamber 12 increases, so that ink droplets are discharged from the nozzle openings 21.

Figure 4:
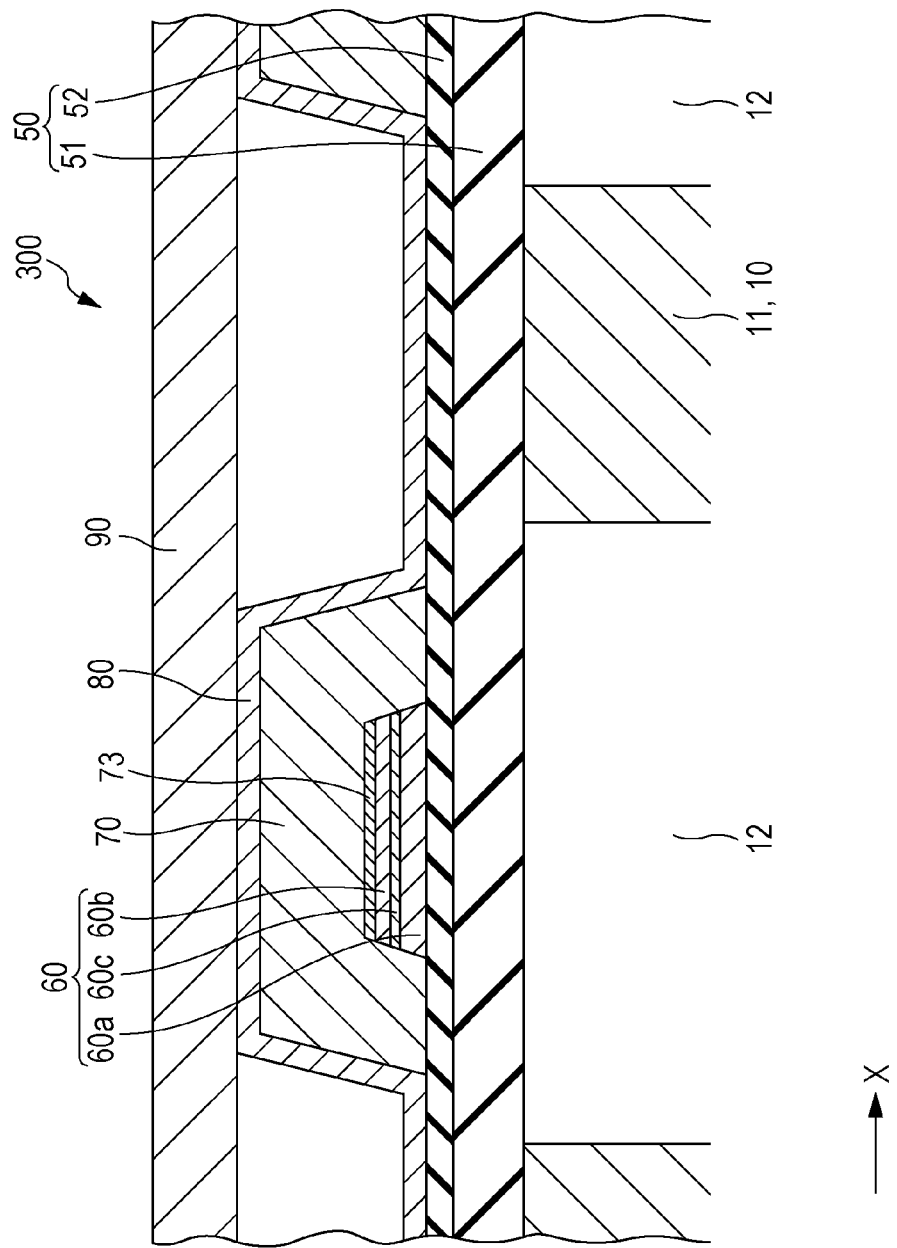
FIG. 4 is a cross sectional view for explaining the configuration of a first electrode and the like of the recording head according to Embodiment 1.
Figure 5A:
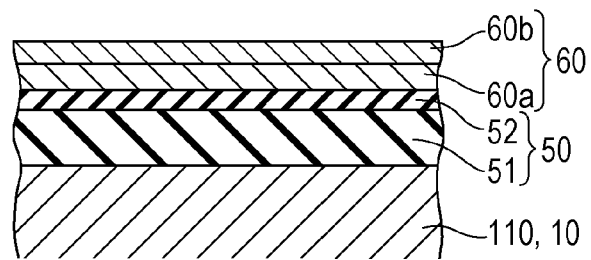
FIGS. 5A to 5C are cross sectional views for explaining the configuration of the first electrode and the like of the recording head according to Embodiment 1.
Figure 5B:
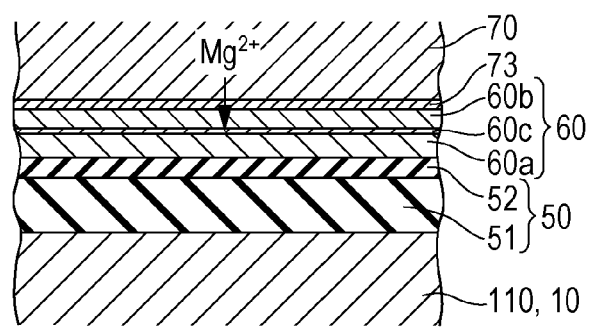
Figure 5C:
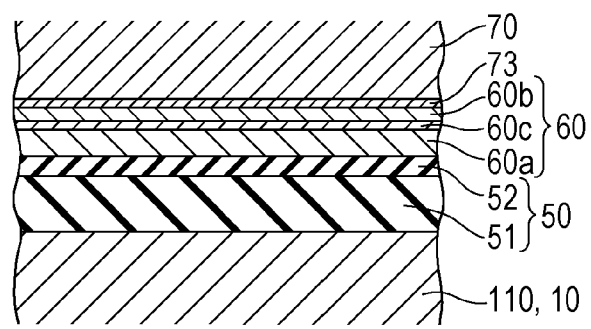

Herein, a portion of the actuator of this embodiment is described in more detail with reference to FIG. 4 and FIGS. 5A to 5C. FIG. 4 is an enlarged cross sectional view along the IV-IV line of FIG. 3B. FIGS. 5A to 5C are further enlarged view of a portion of the first electrode 60.

First, as illustrated in FIG. 4, the first electrode 60 is formed with a width smaller than the width of the pressure generating chamber 12 in the first direction X. As described above, in the piezoelectric layer 70, a concave portion 71 having a width which is almost the same or larger than the width between the partitions 11 in the first direction X is formed. Herein, an example in which the width of the piezoelectric layer 70 is smaller than the width between the partitions 11 due to the concave portion 71 having a width larger than the width between the partitions 11 is illustrated. The second electrode 80 is disposed in such a manner as to be overlapped also with the insulator film 52 in addition to the piezoelectric layer 70 but the configuration is not limited to the example.

The piezoelectric element 300 configuring the actuator of this embodiment is configured from a laminate of the first electrode 60, the piezoelectric layer 70, and the second electrode 80 as described above. Among the above, the piezoelectric layer 70 contains a composite oxide of an $ABO_3$ type perovskite structure containing Mg.

In the $ABO_3$ type perovskite structure, 12 oxygen atoms are coordinated in the A site and 6 oxygen atoms are coordinated in the B site to form an octahedron. In the composite oxide of the perovskite structure containing Mg, the Mg is generally contained in the B site. There is a possibility that a very small amount of Mg is contained in the A site but the amount of Mg contained in the A site is a negligible amount as compared with the amount of Mg contained in the B site.

In this embodiment, as the piezoelectric layer 70, one (hereinafter sometimes abbreviated as "PMN-PT") containing a composite oxide represented by the following general formula (1) containing a tetragonal ceramic in which lead magnesium niobate ($Pb(Mg_{1/3}, Nb'_{2/3})O_3$) and lead titanate ($PbTiO_3$) form a slid solution is used. In the composite oxide example, Pb is located in the A site and Mg, Nb, and Ti are located in the B site.

When PMN-PT is used as the composite oxide of the perovskite structure containing Mg, a composite oxide represented by the following general formula (2) in which Pb is excessively present in terms of the stoichiometry of the $ABO_3$ structure can also be used. Moreover, Mg may be partially replaced by metal species capable of taking a valence of +2, such as Mn, Fe, Ni, Co, and Zn and Ti may be partially replaced by metal species capable of taking a valence of +4, such as Zr. Thus, a further improvement of the piezoelectric constant may be able to be achieved. More specifically, a configuration in which the composition deviates from the composition of the stoichiometry due to deletion and redundancy and a configuration in which elements are partially replaced by other elements are also included in the piezoelectric layer 70 of this embodiment insofar as the configurations are within the scope of the present invention as described above.

[Formula 1]

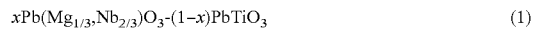

$$x\text{Pb}(\text{Mg}_{1/3},\text{Nb}_{2/3})\text{O}_3\text{-}(1-x)\text{PbTiO}_3 \quad (1)$$

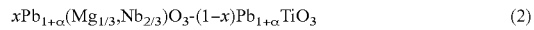

$$x\text{Pb}_{1+\alpha}(\text{Mg}_{1/3},\text{Nb}_{2/3})\text{O}_3\text{-}(1-x)\text{Pb}_{1+\alpha}\text{TiO}_3 \quad (2)$$

($0.20 \leq x \leq 0.60$ is preferable and $0.30 \leq x \leq 0.45$ is more preferable.)

The general formulae (1) and (2) are the composition indication based on the stoichiometry. It is a matter of course that an inevitable deviation of the composition due to lattice mismatching, partial deletion of elements, and the like and also inevitable partial replacement of elements are permitted insofar as the perovskite structure can be taken within the scope of the present invention. For example, when the stoichiometric ratio is set to 1, those having stoichiometric ratios in the range of 0.85 to 1.20 are permitted.

The piezoelectric layer 70 containing the composite oxides represented by the general formulae (1) and (2) has a crystal structure which is a tetragonal. This crystal is {100} oriented to the flow passage formation substrate 10. In this crystal lattice, regions having the (100) plane and the (001) plane vertical to the lamination direction are mixed. The lamination direction can also be referred to as a thickness direction of the piezoelectric element 300 in other words and corresponds to a direction vertical to both the first direction X and the second direction Y described above.

Due to the fact that regions having the (100) plane and the (001) plane vertical to the lamination direction are mixed, the a-axis component and the b-axis component of the tetragonal are 90° rotated around the c-axis component by the application of an electric field, and thus extremely excellent piezoelectric characteristics are demonstrated. Particularly in this embodiment, the crystallite diameter of the piezoelectric material is set to a very small value (for example, 20 nm or less and further 15 nm or less) and a ferroelectric domain (a so-called nanodomain) is formed in each columnar particle disposed through a baked interface and configuring a thin film. Thus, the 90° domain rotation can be efficiently caused, so that the piezoelectric characteristics can be further improved.

More specifically, a piezoelectric layer not involving the 90° domain rotation is also known besides the piezoelectric layer 70 which causes displacement utilizing such 90° domain rotation. However, since such a piezoelectric layer is not displaced based on the angular relationship, such as the 90° domain rotation, both the piezoelectric layers are fundamentally different from each other.

In the case of a piezoelectric material (for example, PZT) which demonstrates the piezoelectric characteristics by induction of an electric dipole moment in the ferroelectric domain, a characteristic that the piezoelectric constant becomes very large near the morphotropic phase boundary in which the crystal structure changes is utilized to adjust the composition ratio to thereby realize a predetermined value in many cases, unlike the piezoelectric material utilizing the 90° domain rotation as in the composite oxide of the perovskite structure containing Mg. On the other hand, it is confirmed in the piezoelectric layer 70 containing the piezoelectric material utilizing the 90° domain rotation as in this embodiment that displacement exceeding even the displacement of the PZT can be obtained in a range deviating from the adjusted composition ratio.

As described above, the piezoelectric layer 70 capable of achieving a further improvement of the piezoelectric characteristics can be configured by the use of PMN-PT containing Pb in the A site of the perovskite structure and containing Mg, Nb, and Ti in the B site. However, the piezoelectric layer 70 is not limited to the example described above and, for example, bismuth ferrate magnesium (Pb(Mg, Fe)O$_3$) containing Pb in the A site of the perovskite structure and containing Mg and Fe in the B site, lead magnesium niobate (Pb(Mg, Nb)O$_3$) containing Pb in the A site and containing Mg and Nb in the B site, potassium sodium bismuth magnesium niobate ((K, Na, Bi) (Mg, Nb)O$_3$) containing K, Na and Bi in the A site and containing Mg and Nb in the B site, bismuth magnesium titanate (Bi(Mg, Ti)O$_3$) containing Bi in the A site and containing Mg and Ti in the B site, and the like may be acceptable.

More specifically, by configuring the piezoelectric layer 70 further containing at least one selected from the group consisting of Pb, Bi, K, and Na in the A site and containing Mg and further containing at least one selected from the group consisting of Nb, Ti, and Fe in the B site of the perovskite structure, such a configuration is advantageous in achieving an improvement of the piezoelectric characteristics and securing high reliability. Also in these cases, a configuration in which the composition deviates from the composition of the stoichiometry due to deletion and redundancy and a configuration in which elements are partially replaced by other elements (Mn, Ni, Co, Zn, and the like) are also included in the piezoelectric layer insofar as the configurations are within the scope of the present invention. Further, it is a matter of course that an inevitable deviation of the composition due to lattice mismatching, partial deletion of elements, and the like and also inevitable partial replacement of elements are permitted.

If possible, the piezoelectric layer may be one containing Mg in the A site of the perovskite structure. However, the piezoelectric layer 70 containing Mg in the B site of the perovskite structure as described above is preferable from the viewpoint of achieving an improvement of the piezoelectric characteristics and securing high reliability.

Such a piezoelectric layer 70 is laminated on the first electrode 60 through the base layer 73 containing PZT. In particular, by configuring the piezoelectric layer 70 having the base layer 73 having lattice matching of less than 1% with the c-axis of the composite oxide of the piezoelectric layer 70 and having lattice mismatching of 1% or more with the a-axis and the b-axis of the composite oxide, the orientation control of the piezoelectric material can be facilitated and the c-axis component of the piezoelectric material which is a tetragonal can be stabilized. Therefore, such a configuration is advantageous in improving the piezoelectric characteristics of the piezoelectric layer 70. The total number of the base layers is not limited and a configuration in which the piezoelectric layer 70 and the base layer 73 are alternately laminated may be acceptable.

The first electrode 60 has the diffusion suppressing layer 60a and the diffusion layer 60b. The diffusion suppressing layer 60a suppresses the diffusion of Mg. The diffusion layer 60b diffuses the Mg as compared with the diffusion suppressing layer 60a. The diffusion suppressing layer 60a is provided on the flow passage formation substrate 10 side relative to the diffusion layer 60b. The diffusion layer 60b is provided on the piezoelectric layer 70 side relative to the diffusion suppressing layer 60a.

When the piezoelectric material containing the composite oxide of the perovskite structure containing Mg is used, the Mg passed through the first electrode 60 to diffuse up to the flow passage formation substrate 10 and the diaphragm 50 depending on materials of the first electrode 60, aspects of various configurations, and the like in a baking process which is one of the formation processes of the piezoelectric layer in former cases. In particular, shape processing of a Si wafer by a photolithographic method is used in the production of a MEMS element in many cases. Si reacts with the Mg element to form magnesium silicate. Therefore, when a heating process is included in the production processes of the MEMS element, the silicate as described above is likely to be generated. When the silicate is generated, a good interface cannot be formed. Therefore, in the case of a liquid ejecting head, problems may arise that the displacement characteristics and the durability of a diaphragm are changed, so that the discharge characteristics of ink and the like deteriorate, for example. Also in a piezoelectric element to be used for uses other than the liquid ejecting head, the problems of the changes in the characteristics and the deterioration may arise for the same reason.

However, the diffusion suppressing layer 60a can prevent the Mg from the piezoelectric layer 70 from passing through the first electrode 60 and reaching the flow passage formation substrate 10 and the diaphragm 50 in this embodiment. The diffusion layer 60b can diffuse the Mg from the piezoelectric layer 70 into the diffusion layer 60b to be able to unevenly distribute the Mg in the first electrode 60, specifically in front of the diffusion suppressing layer 60a, so that the Mg can also be prevented from being unevenly distributed on the interface between the piezoelectric layer 70 and the first electrode 60. As described above, the piezoelectric layer 70 and the first electrode 60 and the first electrode 60 and the diaphragm 50 can form good interfaces, and thus high reliability can be secured.

The diffusion suppressing layer 60a can be configured from materials containing Pt, for example. By the use of noble metal materials having conductivity, such as Pt, the diffusion of the Mg from the piezoelectric layer 70 can be suitably suppressed.

The diffusion layer 60b can be configured from materials containing at least one selected from the group consisting of Ir, $LaNiO_3$, and $SrRuO_3$, for example. By the use of such a conductive material, the Mg from the piezoelectric layer 70 can be suitably diffused.

However, the materials or the structures of the diffusion suppressing layer 60a and the diffusion layer 60b are not limited to the examples described above. The diffusion suppressing layer 60a may be configured to have a Mg diffusion suppression function of preventing the Mg from the piezoelectric layer 70 from reaching the flow passage formation substrate 10 and the diaphragm 50. The diffusion layer 60b may be configured to have a function of preventing the Mg from the piezoelectric layer 70 from being unevenly distributed on the interface with the first electrode 60 and diffusing the Mg as compared with the diffusion suppressing layer 60a. In this embodiment, each layer is configured from a single layer but may be configured from a multiple layer. The diffusion suppressing layer 60a is disposed on the flow passage formation substrate 10 side and the diffusion layer 60b is disposed on the piezoelectric layer 70 side relative to the diffusion suppressing layer 60a, and then second and third diffusion suppressing layers and diffusion layers may be further disposed between the diffusion suppressing layer 60a and the diffusion layer 60b.

The first electrode 60 of this embodiment has a Mg uneven distribution layer 60c in which the Mg from the piezoelectric layer 70 is unevenly distributed on the diffusion suppressing layer 60a side of the diffusion layer 60b. As illustrated in FIG. 5A, in the stage (stage in which the piezoelectric layer 70 is not produced) immediately after the production of the first electrode 60, the Mg uneven distribution layer 60c is not present and the diffusion suppressing layer 60a and the diffusion layer 60b are adjacent to each other.

When the formation of the piezoelectric layer 70 starts, Mg contained in a piezoelectric material passes through the base layer 73 containing PZT to diffuse into the first electrode 60 in a baking process included in the formation processes of the piezoelectric layer 70. As illustrated in FIG. 5B, the Mg diffuses into the diffusion layer 60b of the first electrode 60 and is to partially diffuse into the diaphragm 50 side. However, the diffusion of the Mg into the diaphragm 50 side is suppressed in front of the diffusion suppressing layer 60a.

The formation process of the piezoelectric layer 70 includes a plurality of baking processes in many cases. When a plurality of baking processes are included, the Mg contained in the piezoelectric material passes through the base layer 73 containing PZT to diffuse into the diffusion layer 60b every time the baking process is carried out but the diffusion of Mg into the diaphragm 50 side is suppressed in front of the diffusion suppressing layer 60a. The Mg which is suppressed from diffusing is likely to be stored in a portion on the diffusion suppressing layer 60a side of the diffusion layer 60b, irrespective of the number of times of the baking processes, e.g., once or two or more times. As a result, the completed piezoelectric layer 70 has the Mg uneven distribution layer 60c in which the Mg is unevenly distributed on the diffusion suppressing layer 60a side of the diffusion layer 60b as illustrated in FIGS. 5B and 5C.

The presence of such a Mg uneven distribution layer 60c can be confirmed by performing measurement by secondary ion mass spectrometry in a direction from the piezoelectric layer 70 to the flow passage formation substrate 10. When measured by secondary ion mass spectrometry in the direction from the piezoelectric layer 70 to the flow passage formation substrate 10, the maximum intensity of the Mg in the Mg uneven distribution layer 60c is higher than the intensity of the Mg of the diffusion suppressing layer 60a and the diffusion layer 60b. The presence of the Mg uneven distribution layer 60c supports the fact that the Mg diffusion suppression effect by the diffusion suppressing layer 60a is high and the reliability of the piezoelectric element is high. More specifically, by providing the Mg uneven distribution layer, high reliability can be more certainly secured.

Materials of the second electrode 80 provided on the piezoelectric layer 70 are not particularly limited and materials having conductivity may be acceptable.

Next, an example of a method for manufacturing the piezoelectric element of this embodiment described above is described with reference to FIGS. 6A to 8C together with an example of a method for manufacturing an ink jet recording head on which the piezoelectric element is mounted.

Figure 6A:
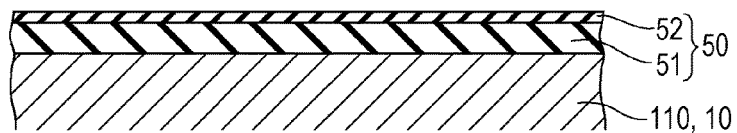
FIGS. 6A to 6E are views for explaining a manufacturing example of the recording head according to Embodiment 1.

First, the diaphragm 50 is produced on the surface of a wafer 110 for flow passage formation substrate which is a silicon wafer. In this embodiment, the diaphragm 50 containing a laminate of silicon dioxide (elastic film 51) formed by thermally oxidizing the wafer 110 for flow passage formation substrate and zirconium dioxide (insulator film 52) formed by film formation by a sputtering method, followed by thermal oxidation was produced. As illustrated in FIG. 6A, an adhesion layer (not illustrated) containing Ti and the like is further formed on the diaphragm 50 in this embodiment but the adhesion layer can be omitted.

Figure 6B:
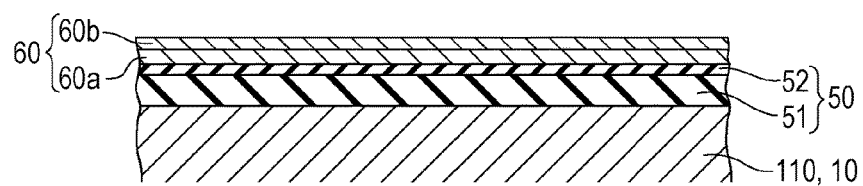

Subsequently, as illustrated in FIG. 6B, the diffusion suppressing layer 60a and the diffusion layer 60b are sequentially formed on the entire surface of the adhesion layer of the diaphragm 50 to thereby form the first electrode 60. The diffusion suppressing layer 60a and the diffusion layer 60b can be formed by vapor phase film formation, such as a sputtering method, a PVD method (physical vapor deposition method), and a laser ablation method, liquid phase film formation, such as a spin coating method, and the like, for example. As described above, in this stage (stage in which the piezoelectric layer 70 is not produced), the diffusion suppressing layer 60a and the diffusion layer 60b are adjacent to each other.

Next, the base layer 73 is formed on the first electrode 60. A method for forming the base layer 73 is not limited. For example, according to the MOD (Metal-Organic Decomposition) method, the base layer 73 containing metal oxide can be obtained by applying and drying a solution containing a metal complex, and then further baking the same at high temperature. The base layer 73 can also be formed using chemical solution methods, such as a sol-gel method. In addition thereto, the base layer 73 can also be formed by a laser ablation method, a sputtering method, a pulsed laser deposition method (PLD method), a CVD method, an aerosol deposition method, and the like. Thus, the base layer 73 can be formed by various liquid phase methods and solid phase methods. The base layer 73 can be omitted.

Figure 6C:
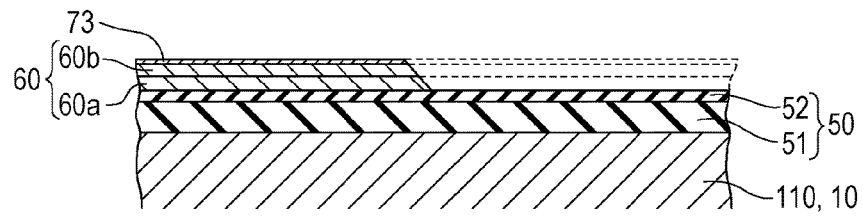

Then, as illustrated in FIG. 6C, the first electrode 60 and the base layer 73 are simultaneously patterned. The patterning herein can be performed by dry etching, such as reactive ion etching (RIE) and ion milling, for example. After only the first electrode 60 is patterned, the base layer 73 may be formed. The patterning of the first electrode 60 and the base layer 73 herein may not be performed, and the piezoelectric layer 70 described later may be laminated on the base layer 73, and then patterning may be performed with the piezoelectric layer 70.

Next, the piezoelectric layer 70 is formed. A method for forming the piezoelectric layer 70 is not limited. The piezoelectric layer 70 can be formed using chemical solution methods, such as the MOD method and a sol-gel method, as in the example of the base layer 73. Besides these methods, the piezoelectric layer 70 can be formed by various liquid phase methods and solid phase methods.

Figure 6D:
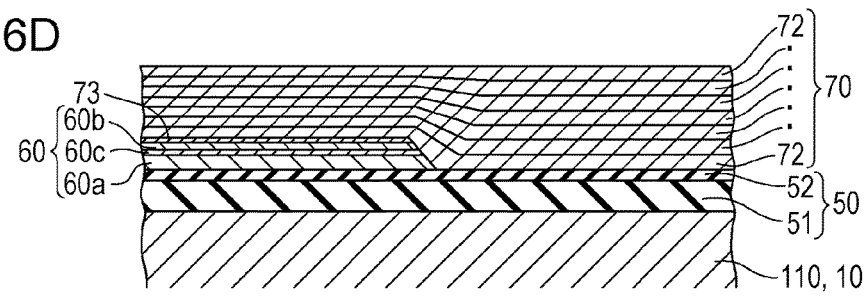

A specific formation procedure example when the piezoelectric layer 70 is formed by the chemical solution methods is as follows. More specifically, a precursor solution forming the piezoelectric layer 70 containing an MOD solution and a sol containing a metal complex is produced. Then, the precursor solution is applied to the first electrode 60 using a spin coating method and the like to form a precursor film 72 (application process). The precursor film is heated to a predetermined temperature, and then dried for a definite period of time (drying process). Then, the dried precursor film is further heated to a predetermined temperature, and then held for a definite period of time for degreasing (degreasing process). By heating the precursor film to a predetermined temperature, and then holding the same for crystallization, the piezoelectric layer 70 illustrated in FIG. 6D is formed (baking process). In order to form the piezoelectric layer 70 with sufficient thickness, the cycle from the application process to the baking process is sometimes repeated two or more times. In this case, a plurality of baking processes are included in the formation processes of the piezoelectric layer 70.

As described above, in the baking process, the Mg contained in a piezoelectric material passes through the base layer 73 to diffuse into the diffusion layer 60b of the first electrode 60. However, the diffusion is suppressed in front of the diffusion suppressing layer 60a, which results in the formation of the Mg uneven distribution layer 60c in which the Mg is unevenly distributed on the diffusion suppressing layer 60a side of the diffusion layer 60b.

The solution applied in the application process is one obtained by mixing a metal complex capable of forming a precursor film of a composite oxide of the perovskite structure containing Mg by baking, and then dissolving or dispersing the mixture in an organic solvent. As the metal complex containing Mg, magnesium acetate and the like are mentioned. Metal complexes containing other metals can also be used. For example, as metal complexes containing Pb, lead acetate and the like are mentioned. As metal complexes containing Bi, bismuth acetate and the like are mentioned. As metal complexes containing K, potassium acetate and the like are mentioned. As metal complexes containing Na, sodium acetate and the like are mentioned. As metal complexes containing Nb, niobium penta-n-butoxide and the like are mentioned. As metal complexes containing Ti, titanium tetra-i-propoxide and the like are mentioned. As metal complexes containing Fe, iron acetate and the like are mentioned.

Figure 6E:
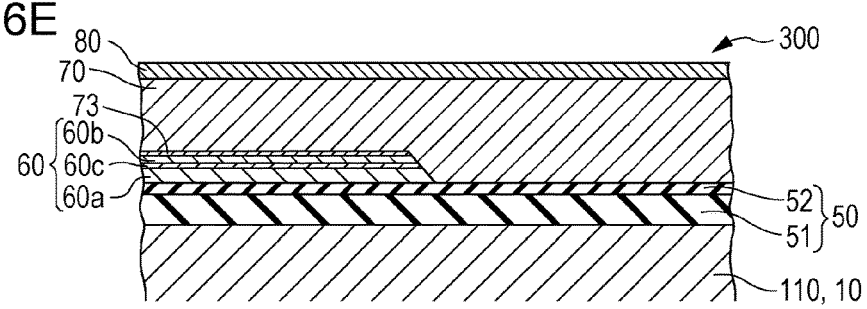

After the formation of the piezoelectric layer 70, as illustrated in FIG. 6E, the second electrode 80 containing Pt and the like is formed on the piezoelectric layer 70 by a sputtering method or the like, and then the piezoelectric layer 70 and the second electrode 80 are simultaneously patterned in a region facing each pressure generating chamber 12 to form the piezoelectric element 300 containing the first electrodes 60, the piezoelectric layer 70, and the second electrode 80.

Figure 7A:
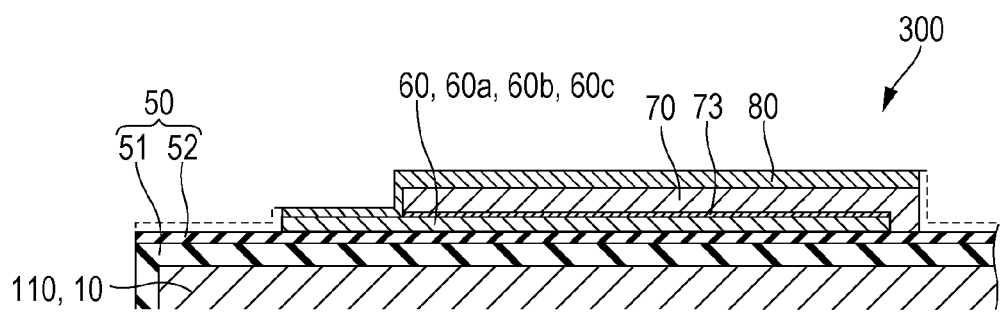
FIGS. 7A and 7B are views for explaining the manufacturing example of the recording head according to Embodiment 1.
Figure 7B:
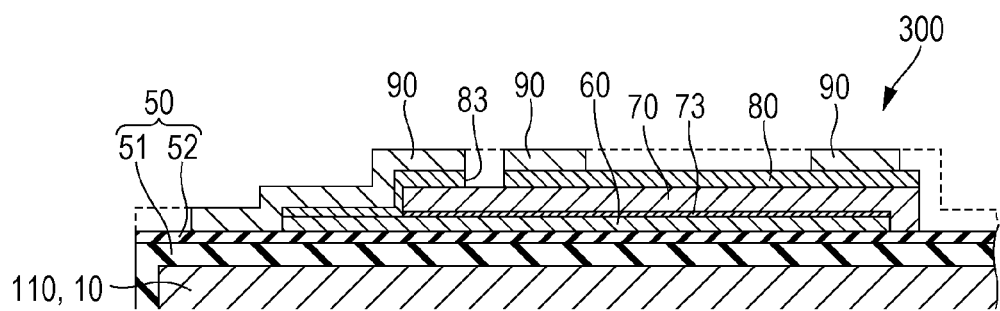

Next, as illustrated in FIG. 7A, necessary portions of the second electrode 80 and the like are patterned to remove a part thereof and also, as illustrated in FIG. 7B, the lead electrode 90 is formed by a sputtering method or the like. A method for forming the lead electrode 90 is not limited to the sputtering method.

Figure 8A:
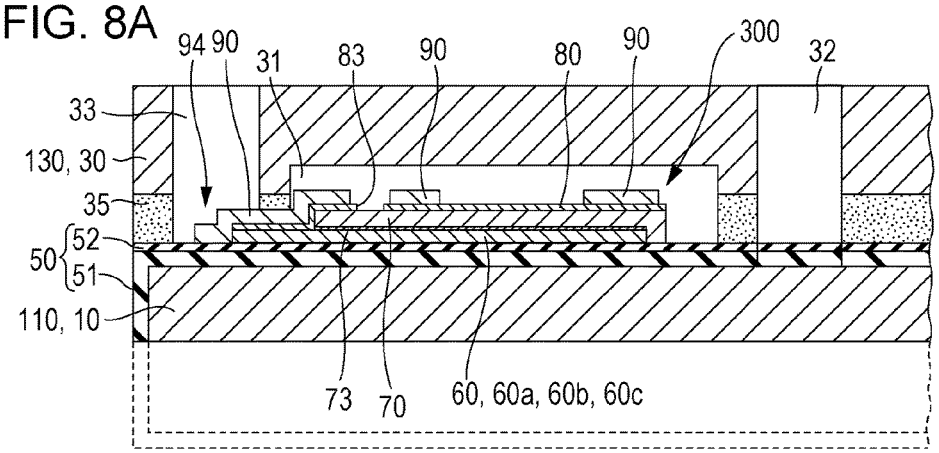
FIGS. 8A to 8C are views for explaining the manufacturing example of the recording head according to Embodiment 1.
Figure 8B:
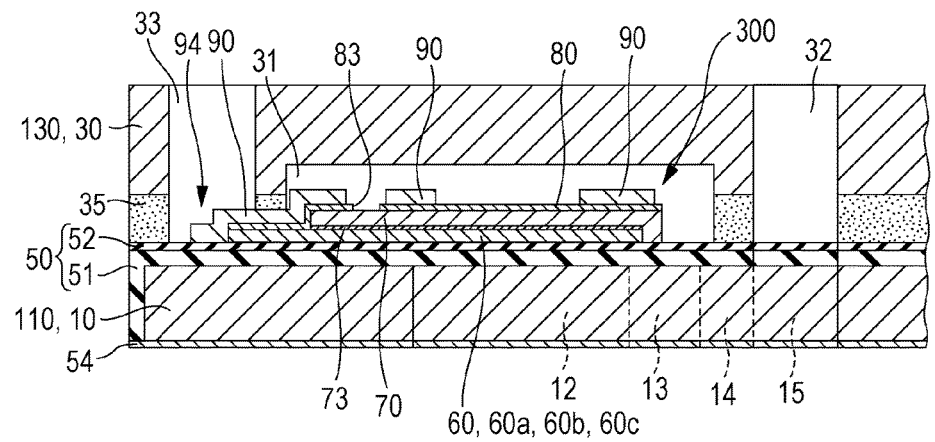
Figure 8C:
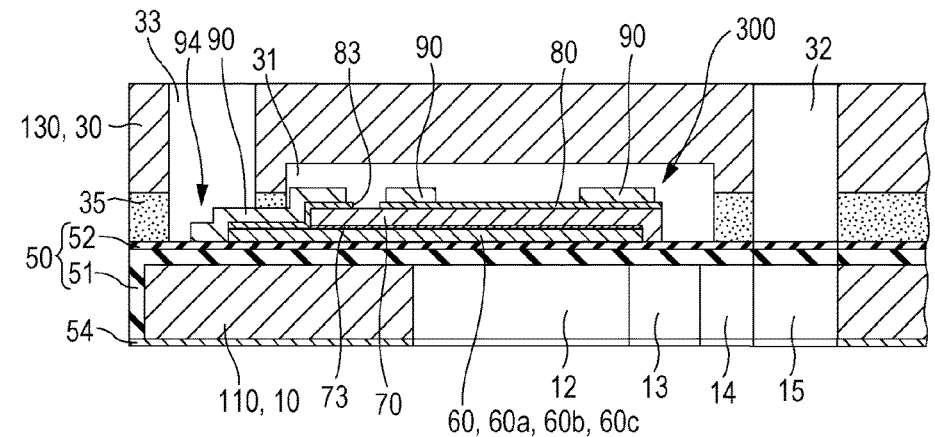

Next, as illustrated in FIG. 8A, a wafer 130 for protective substrate which is a silicon wafer and is formed into a protective substrate 30 is joined to the piezoelectric element 300 side of the wafer 110 for flow passage formation substrate with an adhesive 35 or the like, and then the wafer 110 for flow passage formation substrate is shaved to a predetermined thickness to be thin. Then, as illustrated in FIG. 8B, a mask film 54 is newly formed on the wafer 110 for flow passage formation substrate, and then patterned into a predetermined shape. Further, as illustrated in FIG. 8C, the wafer 110 for flow passage formation substrate is subjected to anisotropic etching (wet etching) using an alkaline solution, such as KOH, through the mask film 54, whereby the pressure generating chamber 12, the communication portion 15, the ink supply path 13, the communication path 14, and the like corresponding to the piezoelectric element 300 are formed.

Thereafter, unnecessary portions of the perimeter edge portion of the wafer 110 for flow passage formation substrate and the wafer 130 for protective substrate are removed by cutting by dicing or the like, for example. Then, the mask film 54 on a surface opposite to the wafer 130 for protective substrate of the wafer 110 for flow passage formation substrate is removed, and then the nozzle plate 20 (FIG. 3B) in which the nozzle openings 21 are formed is joined. By joining a compliance substrate 40 (FIG. 3B) to the wafer 130 for protective substrate, the ink jet recording head 1 is completed.

EXAMPLES

Hereinafter, the present invention is specifically described based on Examples but the present invention is not limited to the description of Examples.

Example 1

Preparation of PZT Precursor Solution

A PZT precursor solution was produced by weighing acetic acid and water, weighing lead acetate, zirconium butoxide, titanium tetra-i-propoxide, and polyethylene glycol, and then heating and stirring them at 90° C. Preparation of PMN-PT precursor solution 2-butoxy ethanol and dimethylamino ethanol were weighed to produce a mixed solution. In a glove box filled with dry nitrogen, titanium tetra-i-propoxide and niobium penta-n-butoxide were weighed, and then mixed with the mixed solution. Thereafter, the mixture was sufficiently stirred at room temperature, magnesium acetate and lead acetate were individually weighed under the atmosphere, and then mixed and stirred at room temperature to produce a PMN-PT precursor solution.
Production of First Electrode, Piezoelectric Layer, and Second Electrode A silicon dioxide film (elastic film 51) was produced on a substrate (flow passage formation substrate 10) by thermally oxidizing a 6 inch silicon substrate. Next, a zirconium film was produced by a sputtering method, and then thermally oxidized to thereby produce a zirconium oxide film (insulator film 52). On the insulator film 52, titanium (Ti), platinum (Pt; diffusion suppressing layer 60a), iridium (Ir; diffusion layer 60b), and titanium (Ti) were produced in this order by a sputtering method to produce the first electrode 60.

The PZT precursor solution was applied to the first electrode 60 by a spin coating method, and then dried/degreased at 140° C. and 370° C. to produce a degreasing film. The degreasing film was heat treated at 737° C. by RTA (Rapid Thermal Annealing) to produce a ceramic film (base layer 73) containing PZT.

Next, the first electrode 60 and the base layer 73 which were produced above were patterned by dry etching to produce a first electrode pattern. The PMN-PT precursor solution was applied to the first electrode pattern by a spin coating method, and then dried/degreased at 180° C. and 350° C. to produce a degreasing film. The degreasing film was heat treated at 750° C. by RTA (Rapid Thermal Annealing) to produce a ceramic film (piezoelectric body film 72) containing PMN-PT. By repeating the ceramic film production process 6 times, a layer (piezoelectric layer 70) containing 7 ceramic films in total was produced.

On the produced piezoelectric layer 70, iridium and titanium were formed into films in this order by a sputtering method, and then electrode baking processing was performed at 740° C. by RTA. Then, patterning was performed by dry etching, iridium and titanium were formed into films in this order by a sputtering method, and then patterning was performed by dry etching again to produce the second electrode 80.

Comparative Example 1

Figure 9:
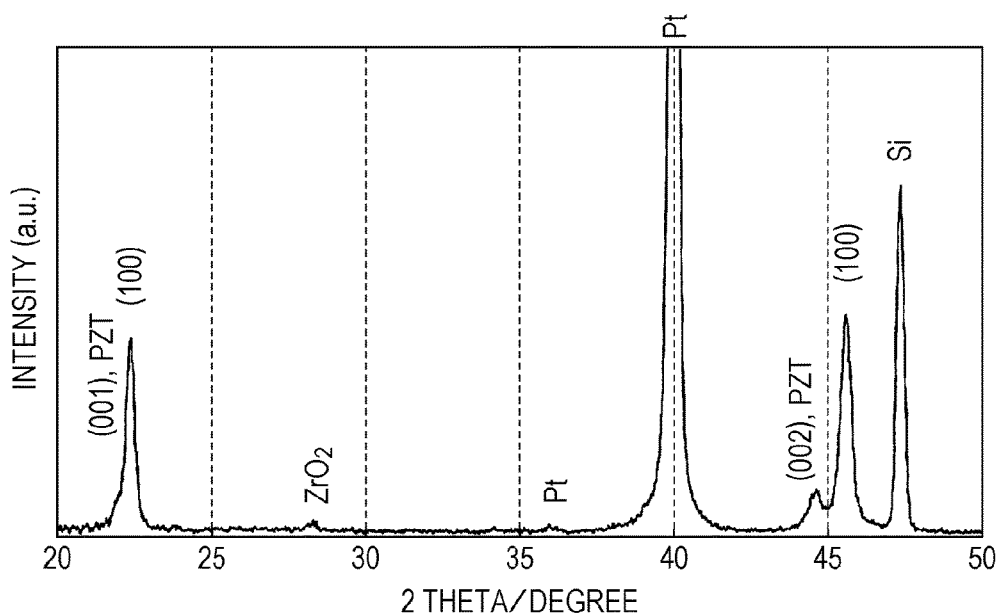
FIG. 9 shows the measurement results of an X ray diffraction pattern with respect to a piezoelectric element according to Example 1.

A piezoelectric element having the same configuration as that of Example 1 was produced, except configuring the piezoelectric layer 70 with PZT.
X-Ray Diffraction Measurement Employing Two-Dimensional Detector With respect to Example 1 and Comparative Example 1, two-dimensional mapping images and diffraction patterns were measured using "D8 Discover" manufactured by Bruker AXS, CuKα as the radiation source, and a two-dimensional detector (GADDS) as a detector to evaluate the crystal structure and the crystal orientation of the piezoelectric layers. The ranges detectable as images are $\phi=\pm 30°$ equivalent to $2\theta=22.5°$ at which the (100) peak of a typical $ABO_3$ pseudo-cubic crystal is detected, $\phi=\pm 32°$ equivalent to $2\theta=\pm 32.5°$ at which the (110) peak of a typical $ABO_3$ pseudo-cubic crystal is detected, and $\phi=\pm 26°$ equivalent to $2\theta=40°$ at which the (111) peak of a typical $ABO_3$ pseudo-cubic crystal is detected in terms of the limitation due to the apparatus configuration. FIG. 9 shows the X ray diffraction pattern in Example 1 (stage before the production of the second electrode).

As shown in FIG. 9, in Example 1, only the peaks of Si, $ZrO_2$, Pt, PZT, and PMN-PT were observed and no heterophases were observed. Since (100) and (001) and (200) and (002) are clearly separated (Although the peaks are overlapped with PZT, the presence of (001) and (002) of PMN-PT can be confirmed.), it is found that the crystal structure of the piezoelectric layer 70 in Example 1 is a tetragonal structure when a general PMN-PT phase diagram is taken into consideration.

It was clarified that the orientation of the crystal structure is the {100} orientation of 99% or more based on the fact that only the peaks (100) and (001) are observed in FIG. 9 and the two-dimensional photograph.

Figure 10:
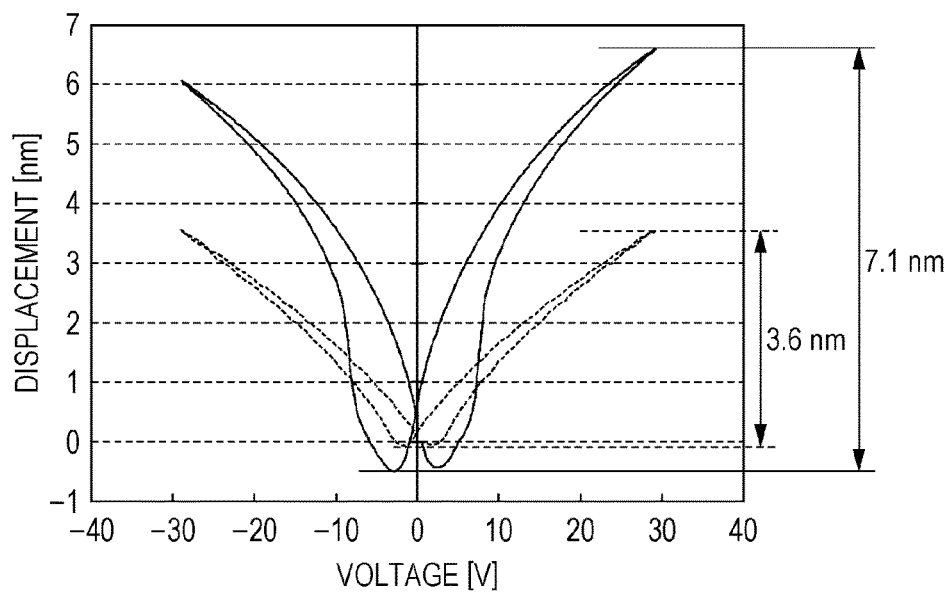
FIG. 10 shows the measurement results of displacement characteristics (piezoelectric characteristics) with respect to the piezoelectric element according to Example 1 and a piezoelectric element according to Comparative Example 1.
Figure 11:
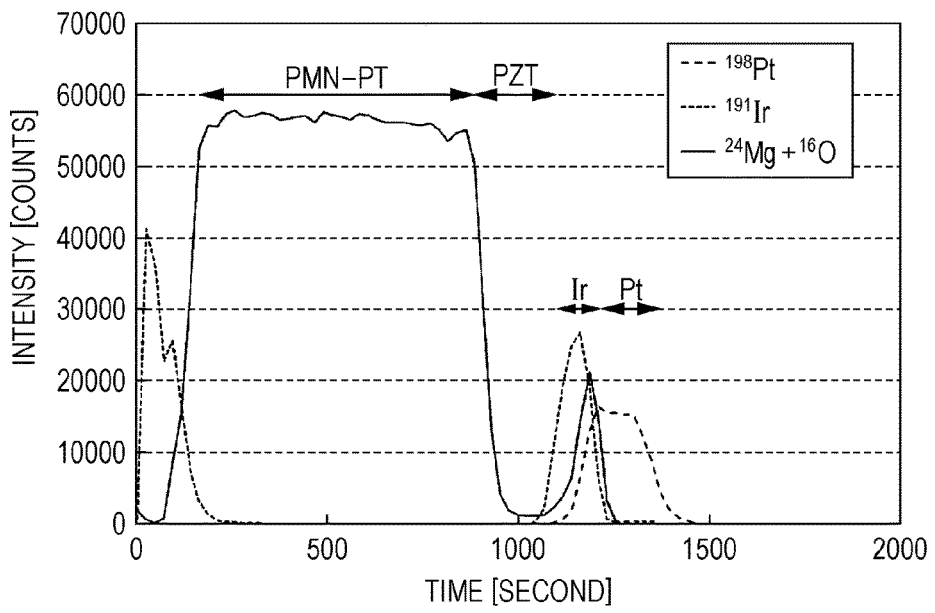
FIG. 11 shows the measurement results of secondary ion mass spectrometry with respect to the piezoelectric element according to Example 1.
Figure 12:
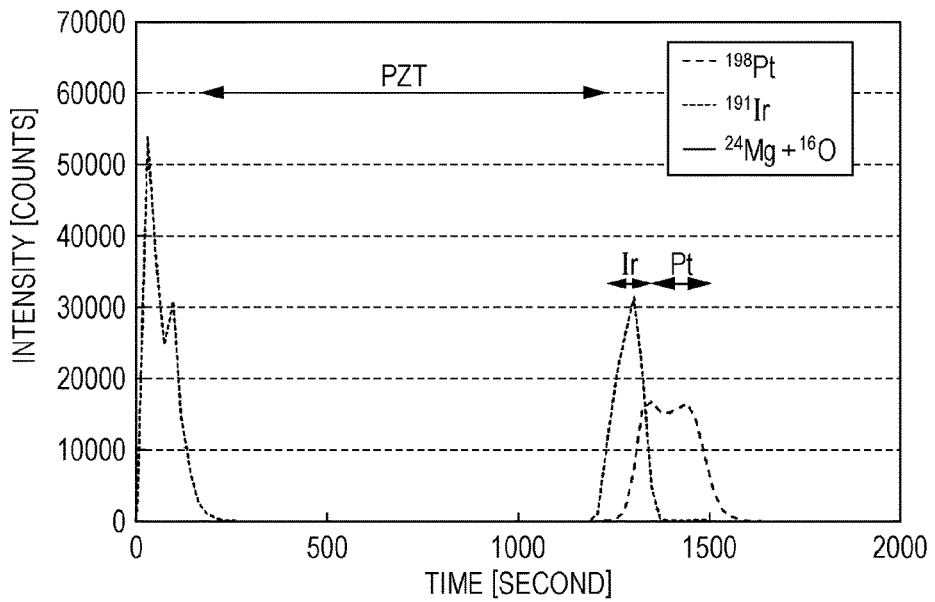
FIG. 12 shows the measurement results of secondary ion mass spectrometry with respect to the piezoelectric element according to Comparative Example 1.

As a result of performing the same measurement also for Comparative Example 1, the crystal is a pseudo-cubic crystal and no heterophases were observed. Although a detail description is omitted, it is considered that a possibility that the crystal is a trigonal crystal is high from the other measurement and literatures but it was not able to be identified by the X ray diffraction measurement herein.
Measurement of Displacement Characteristics Using DBLI With respect to Example 1 and Comparative Example 1, the piezoelectric characteristics (displacement characteristics) of the piezoelectric element were evaluated by performing measurement with a Double-Beam Laser Interometry (DBLI) manufactured by aixACCT. The results are shown in FIG. 10. As shown in FIG. 10, while the maximum displacement (Maximum distortion—Minimum distortion: $D_{pp2}$) was 7.1 nm in the piezoelectric element of Example 1 indicated by the solid line, the $D_{pp2}$ was 3.6 nm in Comparative Example 1 indicated by the dotted lines. This clarified that the piezoelectric element of Example 1 was excellent in the displacement characteristics as compared with the piezoelectric element of Comparative Example 1 and exhibited the displacement 1.95 times that of Comparative Example 1.
Secondary Ion Mass Spectrometry With respect to Example 1 and Comparative Example 1, the Mg distribution state was evaluated by performing secondary ion mass spectrometry using "ADEPT-1010" manufactured by ULVAC-PHI, INCORPORATED., over the thickness direction from the piezoelectric layer 70. The results in Example 1 are shown in FIG. 11 and the results in Comparative Example 1 are shown in FIG. 12. In each figure, the vertical axis represents the detected intensity standardized in terms of $^{16}O+^{133}Cs$ and the horizontal axis represents the sputtering time. The progress of the sputtering time corresponds to the depth in the thickness direction. Therefore, the Mg states at deeper points in a direction from the piezoelectric layer 70 to the diaphragm 50 toward the right of the horizontal axis in FIG. 11 and FIG. 12 are evaluated.

First, the peak of $^{24}Mg+^{16}O$ was not observed in Comparative Example 1 shown in FIG. 12. This shows that $^{24}Mg+^{16}O$ can be measured without being affected by disturbance elements in PZT, Ir, Pt, and $ZrO_2$ under the present measurement conditions.

On the other hand, in Example 1 shown in FIG. 11, the peak of $^{24}Mg+^{16}O$ was observed in the range of the piezoelectric layer 70 containing PMN-PT and in the range in front of a Pt layer (diffusion suppressing layer 60a) in an Ir layer (diffusion layer 60b). On the other hand, in the range of the base layer 73 containing PZT, the Mg diffusing from PMN-PT was slightly observed and a predominant amount of Mg was not observed in a $ZrO_2$ layer (insulator film 52) under the diffusion suppressing layer 60a. This showed that, when Mg diffused and passed through the base layer 73 containing PZT, and then passed through the Ir layer (diffusion layer 60b) having high Mg passing ability in baking, the diffusion was suppressed in front of the Pt layer (diffusion suppressing layer 60a) with low Mg diffusion ability. As a result, the Mg was unevenly distributed (Mg uneven distribution layer 60c) in front of the diffusion suppressing layer 60a in the diffusion layer 60b, so that the diffusion of the Mg into the diaphragm 50 was suppressed.

Other Embodiments

As described above, one embodiment of the present invention is described but the fundamental configuration of the present invention is not limited to the configurations described above. For example, the silicon single crystal substrate is mentioned as an example of the flow passage formation substrate 10 in the embodiment described above but the configuration is not particularly limited thereto and, for example, materials, such as a SOI substrate and glass, may be used.

An example of a piezoelectric element-applied device other than the ink jet recording head employing the piezoelectric element of the present invention for the electromechanical conversion mechanism of a MEMS element is described. For example, as a piezoelectric element-applied device, an ultrasonic measurement device can also be configured by providing the piezoelectric element of the present invention and a control means for measuring a detection target utilizing a signal based on at least one of ultrasonic waves transmitted by the piezoelectric element and ultrasonic waves received by the piezoelectric element.

Such an ultrasonic measurement device obtains information on the position, shape, speed, and the like of a measurement target based on the period of time from the time when ultrasonic waves are transmitted to the time when an echo signal, which is generated by reflection of the transmitted ultrasonic waves to the measurement target and returning thereof, is received, in which a piezoelectric element is sometimes used as an element for generating ultrasonic waves and an element for detecting the echo signal. When the piezoelectric element of the present invention in which an improvement of the piezoelectric constant is achieved is used as such an ultrasonic wave generation element or an echo signal detection element, an ultrasonic measurement device in which the ultrasonic wave generation efficiency and the echo signal detection efficiency are improved can be provided.

Moreover, it is a matter of course that a liquid ejecting head of ejecting liquid other than ink can also be configured as the piezoelectric element-applied device. Examples of such a liquid ejecting head include, for example, various recording heads for use in an image recording apparatus, such as a printer, coloring material ejecting heads for use in production of color filters of a liquid crystal display and the like, electrode material ejecting heads for use in electrode formation of an organic EL display, a field emission display (FED), and the like, bioorganic compound ejecting heads for use in production of biochip, and the like.

In addition thereto, examples of the piezoelectric element-applied device include, for example, ultrasonic devices, such as an ultrasonic transmitter, an ultrasonic motor, a temperature-electricity converter, a pressure-electricity converter, a ferroelectric transistor, a piezoelectric transformer, filters, such as a blocking filter against harmful light, such as infrared rays, an optical filter employing the photonic crystal effect by quantum dot formation, and an optical filter utilizing optical interference of a thin film, and the like. Moreover, the piezoelectric element of the present invention can also be applied to a piezoelectric element to be used as a sensor and a piezoelectric element to be used as a ferroelectric memory, and thus a piezoelectric element-applied device can be configured. Examples of the sensors to which the piezoelectric element is used include, for example, an infrared sensor, an ultrasonic wave sensor, a thermal sensor, a pressure sensor, a pyroelectric sensor, a gyroscope sensor (angular velocity sensor), and the like.

In addition thereto, the piezoelectric element-applied device also includes those employing the piezoelectric element 300 of the present invention as a ferroelectric element. As ferroelectric elements which can be suitably used, a ferroelectric transistor (FeFET), a ferroelectric operation circuit (FeLogic), a ferroelectric capacitor, and the like are mentioned. Furthermore, since the piezoelectric element 300 of this embodiment shows good pyroelectric characteristics, the piezoelectric element 300 can be suitably used for pyroelectric elements. As pyroelectric elements which can be suitably used, a temperature detector, a living body detector, an infrared ray detector, a terahertz detector, a heat-electricity converter, and the like are mentioned.

This application claims benefit of Japanese Application No. 2014-213078, filed on Oct. 17, 2014. The disclosure of the prior application is hereby incorporated by reference herein in its entirety.

What is claimed is:

1. A piezoelectric element comprising:
   a substrate;
   a piezoelectric layer including a composite oxide of an $ABO_3$-type perovskite structure that contains Mg;
   a first electrode provided between the substrate and the piezoelectric layer, the first electrode including a diffusion suppressing layer that suppresses diffusion of the Mg from the piezoelectric layer toward the substrate and a diffusion layer that diffuses the Mg to a greater extent than the diffusion suppressing layer, the diffusion suppressing layer being provided between the diffusion layer and the substrate; and
   a second electrode provided on the piezoelectric layer,
   wherein the diffusion layer contains at least one selected from the group consisting of Ir, $LaNiO_3$, and $SrRuO_3$.

2. The piezoelectric element according to claim 1 further comprising a Mg uneven distribution layer in which amounts of the Mg are unevenly distributed therein, the Mg uneven distribution layer being positioned between the diffusion suppressing layer and the diffusion layer.

3. The piezoelectric element according to claim 1, wherein, when intensity of the Mg is measured by secondary ion mass spectrometry in a direction from the piezoelectric layer to the substrate, a maximum intensity of the Mg in the Mg uneven distribution layer is greater than an intensity of the Mg of the diffusion layer and the diffusion suppressing layer.

4. The piezoelectric element according to claim 1, wherein the piezoelectric layer further contains at least one selected from the group consisting of Pb, Bi, K, and Na at the A site of the $ABO_3$ type perovskite structure, contains the Mg, and also contains at least one selected from the group consisting of Nb, Ti, and Fe at the B site of the $ABO_3$ type perovskite structure.

5. The piezoelectric element according to claim 1, wherein the diffusion suppressing layer contains Pt.

6. A piezoelectric element-applied device comprising: the piezoelectric element according to claim 1.

7. A method for manufacturing a piezoelectric element including, from a substrate side, a first electrode, a piezoelectric layer containing a composite oxide of an $ABO_3$ type perovskite structure containing Mg, and a second electrode, which are laminated, the method comprising:
forming the first electrode, the formation of the first electrode including:
providing a diffusion suppressing layer that suppresses diffusion of the Mg from the piezoelectric layer toward the substrate; and
providing a diffusion layer on the diffusion suppressing layer, the diffusion layer permitting diffusion of the Mg to a greater extent than the diffusion suppressing layer.

8. A piezoelectric element comprising:
a substrate;
a piezoelectric layer including a composite oxide of an $ABO_3$-type perovskite structure that contains Mg;
a first electrode provided between the substrate and the piezoelectric layer, the first electrode including a diffusion suppressing layer that suppresses diffusion of the Mg from the piezoelectric layer toward the substrate and a diffusion layer that diffuses the Mg to a greater extent than the diffusion suppressing layer, the diffusion suppressing layer being provided between the diffusion layer and the substrate; and
a second electrode provided on the piezoelectric layer, wherein the diffusion suppressing layer contains Pt.

* * * * *